(12) United States Patent
Diana et al.

(10) Patent No.: US 10,134,964 B2
(45) Date of Patent: Nov. 20, 2018

(54) PASSIVATION FOR A SEMICONDUCTOR LIGHT EMITTING DEVICE

(71) Applicants: KONINKLIJKE PHILIPS N.V., Eindhoven (NL); LUMILEDS LLC, San Jose, CA (US)

(72) Inventors: Frederic S. Diana, Santa Clara, CA (US); Henry Kwong-Hin Choy, Sunnyvale, CA (US); Qingwei Mo, Sunnyvale, CA (US); Serge L. Rudaz, Sunnyvale, CA (US); Frank L. Wei, San Francisco, CA (US); Daniel A. Steigerwald, Cupertino, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 13/904,299

(22) Filed: May 29, 2013

(65) Prior Publication Data

US 2013/0252358 A1    Sep. 26, 2013

Related U.S. Application Data

(63) Continuation of application No. 12/795,272, filed as application No. PCT/IB2011/052071 on May 11, 2011, now Pat. No. 8,471,282.

(51) Int. Cl.

| | |
|---|---|
| *H01L 33/44* | (2010.01) |
| *H01L 33/52* | (2010.01) |
| *H01L 33/60* | (2010.01) |
| *H01L 33/48* | (2010.01) |
| *H01L 33/54* | (2010.01) |
| *H01L 33/38* | (2010.01) |

(Continued)

(52) U.S. Cl.
CPC .............. *H01L 33/60* (2013.01); *H01L 33/08* (2013.01); *H01L 33/385* (2013.01); *H01L 33/44* (2013.01); *H01L 33/486* (2013.01); *H01L 33/54* (2013.01); *H01L 33/46* (2013.01); *H01L 33/52* (2013.01); *H01L 33/56* (2013.01); *H01L 2933/005* (2013.01); *H01L 2933/0025* (2013.01)

(58) Field of Classification Search
CPC .................................. H01L 33/44; H01L 33/52
USPC ........................................................ 438/26, 28
See application file for complete search history.

(56) References Cited

U.S. PATENT DOCUMENTS

| | | | |
|---|---|---|---|
| 4,966,862 A | 10/1990 | Edmond | |
| 6,547,249 B2 * | 4/2003 | Collins et al. | 257/88 |

(Continued)

FOREIGN PATENT DOCUMENTS

| | | |
|---|---|---|
| CN | 101194373 A | 6/2008 |
| EP | 2023412 A1 | 2/2009 |

(Continued)

OTHER PUBLICATIONS

EPO as ISA, PCT/IB11/52071, "International Search Report and Written Opinion", 16 pages.

(Continued)

*Primary Examiner* — David A Zarneke

(74) *Attorney, Agent, or Firm* — Volpe and Koenig, P.C.

(57) ABSTRACT

In embodiments of the invention, a passivation layer is disposed over a side of a semiconductor structure including a light emitting layer disposed between an n-type region and a p-type region. A material configured to adhere to an underfill is disposed over an etched surface of the semiconductor structure.

16 Claims, 1 Drawing Sheet

(51) Int. Cl.
*H01L 33/08* (2010.01)
*H01L 33/46* (2010.01)
*H01L 33/56* (2010.01)

(56) References Cited

U.S. PATENT DOCUMENTS

| | | | |
|---|---|---|---|
| 6,573,557 B1* | 6/2003 | Watanabe | 257/318 |
| 6,692,979 B2* | 2/2004 | Yeh et al. | 438/27 |
| 6,841,802 B2 | 1/2005 | Yoo | |
| 6,878,973 B2 | 4/2005 | Lowery et al. | |
| 7,221,044 B2* | 5/2007 | Fan et al. | 257/676 |
| 7,271,421 B2* | 9/2007 | Yukimoto et al. | 257/92 |
| 7,488,613 B2* | 2/2009 | Kunisato | H01L 33/0079 257/79 |
| 7,488,621 B2 | 2/2009 | Epler et al. | |
| 7,723,737 B2* | 5/2010 | Lee et al. | 257/88 |
| 7,867,795 B2* | 1/2011 | Shiue et al. | 438/28 |
| 7,964,884 B2* | 6/2011 | Lee | 257/98 |
| 8,004,006 B2* | 8/2011 | Nakahara | H01L 33/20 257/103 |
| 8,048,696 B2* | 11/2011 | Shiue | H01L 33/0079 257/E21.599 |
| 8,288,781 B2 | 10/2012 | Seo et al. | |
| 8,329,482 B2* | 12/2012 | Yao et al. | 438/28 |
| 8,338,844 B2 | 12/2012 | Katsuno et al. | |
| 8,470,621 B2* | 6/2013 | Kuo et al. | 438/28 |
| 9,159,888 B2 | 10/2015 | Chitnis et al. | |
| 2005/0093004 A1 | 5/2005 | Yoo | |
| 2005/0151436 A1 | 7/2005 | Lantzy et al. | |
| 2006/0169993 A1* | 8/2006 | Fan et al. | 257/88 |
| 2006/0180818 A1* | 8/2006 | Nagai et al. | 257/89 |
| 2006/0281203 A1 | 12/2006 | Epler et al. | |
| 2007/0023777 A1 | 2/2007 | Sonobe et al. | |
| 2007/0114542 A1* | 5/2007 | Yamazaki et al. | 257/79 |
| 2007/0176188 A1 | 8/2007 | Tanaka et al. | |
| 2007/0262323 A1 | 11/2007 | Sonobe et al. | |
| 2010/0038668 A1* | 2/2010 | Noma | 257/98 |
| 2010/0051987 A1* | 3/2010 | Katsuno | H01L 33/38 257/98 |
| 2010/0078656 A1 | 4/2010 | Seo et al. | |
| 2010/0109030 A1 | 5/2010 | Krames et al. | |
| 2010/0264442 A1 | 10/2010 | Lee | |
| 2010/0283080 A1* | 11/2010 | Margalith et al. | 257/99 |
| 2010/0308367 A1* | 12/2010 | Aldaz et al. | 257/99 |
| 2011/0140078 A1* | 6/2011 | Hsu | 257/13 |
| 2012/0205695 A1 | 8/2012 | Lin et al. | |
| 2017/0194313 A1 | 7/2017 | Kuo et al. | |

FOREIGN PATENT DOCUMENTS

| | | |
|---|---|---|
| JP | 1187771 A | 3/1999 |
| JP | 11-150298 A | 6/1999 |
| JP | 2004-080050 A | 3/2004 |
| JP | 2006279080 A | 10/2006 |
| JP | 2006310657 A | 11/2006 |
| JP | 2007-134415 A | 5/2007 |
| JP | 2007324585 A | 12/2007 |
| JP | 2010-56323 A | 3/2010 |
| JP | 2010-87515 A | 4/2010 |
| KR | 2010-0036618 A | 4/2010 |
| KR | 20100035846 A | 4/2010 |
| WO | 2017/037121 A1 | 3/2017 |

OTHER PUBLICATIONS

Decision to Refuse Office Action for Japan Application #2013-513781 dated Feb. 2, 2016, 8 pages.
First Office Action for China Appl. #201180028217.8 dated Feb. 17, 2015, 19 pages.
Office Action for Japan Application #2013-513781 dated Mar. 17, 2015, 10 pages.
Office Action dated Jul. 20, 2015 from ROC (Taiwan) Patent Application No. 100116209, 9 pages.
Second Office Action dated Oct. 28, 2015 from Chinese Application No. 201180028217.8, 12 pages.
KR Office Action, Application 10-2013-7000306, dated Mar. 2, 2017, 9 pps.
TW Office Action, Application 105106571, dated Oct. 4, 2016, 7 pps.
Office Action of Japan Patent Office, Appeal Decision dated Apr. 4, 2017, Japan Application No. 2013-513781, 28 pages.
JP Office Action dated May 16, 2017, Japan Application No. 2016-110800, 10 pages.

* cited by examiner

PASSIVATION FOR A SEMICONDUCTOR LIGHT EMITTING DEVICE

CROSS REFERENCE TO RELATED APPLICATION

This is a division of U.S. application Ser. No. 12/795,272, filed Jun. 7, 2010 by Frederic Diana et al., and titled "Passivation for a semiconductor light emitting device". U.S. application Ser. No. 12/795,272 is incorporated herein by reference.

BACKGROUND

Field of Invention

The present invention relates to a passivation layer on a semiconductor light emitting device.

Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

U.S. 2006/0281203 describes "techniques for mounting LEDs for packaging and for removing the growth substrate of the LEDs." An underfill material is injected between the carrier and die to provide support to the epitaxial structure during substrate removal. A portion of the semiconductor structure is supported by the interconnects between the die and the carrier, and a portion is supported by the underfill. To prevent cracking when the semiconductor structure is exposed to stress, for example during substrate removal, the mechanical compliance and coefficient of thermal expansion of the interconnects and the underfill are preferably matched. Examples of suitable underfill materials include FB4511 epoxy available from Henkel Corporation, and silicones and other epoxies loaded with inorganic materials such as silica or alumina to reach the desired coefficient of thermal expansion and mechanical compliance. Since the underfill provides support for the epitaxial layers, it is desirable for the underfill to fill all gaps between the interconnects and to avoid the formation of air bubbles which may encourage cracking of the epitaxial structure during substrate removal. Accordingly, the surface tension of the underfill material may be selected such that the underfill fills all gaps between the interconnects. Alternatively, a partial vacuum may be created on a side of the gap between the carrier and the die opposite the side where the underfill is injected, to draw the underfill into all gaps between the interconnects.

SUMMARY

It is an object of the invention to provide a passivation layer for a semiconductor light emitting device.

In a method according to some embodiments of the invention, a structure is provided. The structure includes a wafer comprising a plurality of semiconductor light emitting devices, each light emitting device comprising a light emitting layer disposed between an n-type region and a p-type region. The structure further includes a passivation layer disposed on a side of at least one of the semiconductor light emitting devices and a first material disposed on the wafer between two semiconductor light emitting devices. The method further includes disposing a second material between the structure and a mount. The first material is configured to adhere to the second material. The structure is attached to the mount.

In some embodiments of the invention, a device includes a semiconductor structure comprising a light emitting layer disposed between an n-type region and a p-type region. A passivation layer is disposed over at least part of a sidewall of the semiconductor structure. A material configured to adhere to an underfill is disposed over an etched surface of the semiconductor structure.

In some embodiments of the invention, a structure includes a wafer comprising a plurality of semiconductor light emitting devices, each light emitting device comprising a light emitting layer disposed between an n-type region and a p-type region. A passivation layer is disposed on a side of at least one of the semiconductor light emitting devices. A material configured to adhere to an underfill is disposed on the wafer between two semiconductor light emitting devices.

The passivation layer may be, in some embodiments, the underfill, a dielectric layer, or a multilayer stack. The passivation layer may be configured to prevent contaminants from contacting the semiconductor light emitting device, which may improve the performance of a device and avoid device failure. The material disposed on the wafer between two semiconductor light emitting devices improves the adherence of the underfill to the wafer, which may also improve passivation of the device.

DETAILED DESCRIPTION

Though in the examples below the semiconductor light emitting device is a III-nitride LED that emits blue or UV light, semiconductor devices besides LEDs such as laser diodes and semiconductor devices made from other materials systems such as other III-V materials, III-phosphide, III-arsenide, II-VI materials, or Si-based materials may be used.

Figure 1:
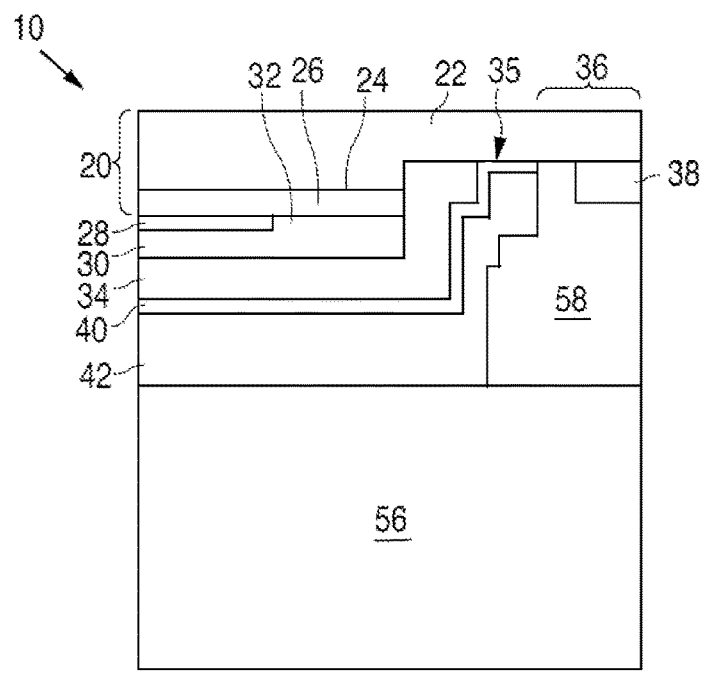
FIG. 1 illustrates a portion of a wafer of flip chip light emitting devices with a dielectric layer disposed in a street between adjacent devices (adjacent devices are not shown).

FIG. 1 illustrates a portion of a wafer of thin film flip chip light emitting devices. To form the structure illustrated in FIG. 1, first a semiconductor structure 20 is grown over a growth substrate. The semiconductor structure 20 includes a light emitting or active region 24 sandwiched between n- and p-type regions 22 and 26. An n-type region 22 is typically grown first over the growth substrate and may include multiple layers of different compositions and dopant concentration including, for example, preparation layers such as buffer layers or nucleation layers, which may be n-type or not intentionally doped, and n- or even p-type device layers designed for particular optical or electrical properties desirable for the light emitting region to efficiently emit light. A light emitting or active region 24 is grown over the n-type region 22. Examples of suitable light emitting regions include a single thick or thin light emitting layer, or a multiple quantum well light emitting region including multiple thin or thick light emitting layers separated by barrier layers. A p-type region 26 is grown over the light emitting region 24. Like the n-type region 22, the p-type region 26 may include multiple layers of different composition, thickness, and dopant concentration, including layers that are not intentionally doped, or n-type layers.

One or more p-contact metals 28, such as, for example, silver, is deposited on the p-type region 26, then portions of the p-type region and active region are etched away to expose a portion 35 of an n-type layer on which an n-contact 40 is later formed. The p-contact 28 may be sealed by one or more guard layers 30 and 32 disposed beside and over p-contact 28. Guard layers 30 and 32 may be, for example, a dielectric layer with openings that expose p-contact 28 or, as illustrated in FIG. 1, one or more metal layers such as TiW. One or more dielectric layers 34, such as, for example, $Si_3N_4$ formed by, for example, plasma enhanced chemical vapor deposition (PECVD) is disposed over guard layer 30 to electrically isolate the conductive structure connected to the p-type region (including p-contact 28 and guard layers 30 and 32) and the n-contact 40. Openings are formed in dielectric layer 34 in the regions 35 where n-contact 40 electrically contacts n-type region 22, then the n-contact metal 40, such as, for example, aluminum, is formed. A bonding metal 42, such as, for example, gold, is formed over n-contact 40 to facilitate bonding each device to a mount 56 and electrical contact with the mount.

The p-contact 28 and n-contact 40 are formed on the same side of the semiconductor structure. In some embodiments either or both the n-contact 40 and the p-contact 28 are reflective and the device is mounted such that light is extracted through the top of the device in the orientation illustrated in FIG. 1. In some embodiments, the contacts may be limited in extent or made transparent, and the device may be mounted such that light is extracted through the surface on which the contacts are formed.

The wafer of devices is attached to a mount 56, for example by ultrasonic bonding, thermosonic bonding, or thermocompression bonding of bonding layer 42 to a bonding layer (not shown in FIG. 1) formed on mount 56. Before, during, or after attaching wafer 10 to mount 56, an underfill 58 is disposed in any areas between the semiconductor device wafer 10 and mount 56 where the semiconductor device wafer 10 is not supported by the bonding layers. The underfill 58 may be, for example, a dielectric layer or other solid layer that is deposited on wafer 10 or mount 56 and patterned, or a material such as silicone, epoxy, or any other suitable material that is injected between wafer 10 and mount 56 after bonding then cured into a solid. Underfill 58 supports wafer 10 during processing and operation of the semiconductor devices, in particular during removal of the growth substrate. For example, a sapphire substrate may be removed by shining a laser through the substrate to melt a layer of semiconductor material in direct contact with the substrate, a process that may create stress in the semiconductor structure. In some embodiments, the semiconductor layer exposed by removing the growth substrate is patterned or roughened, which may improve light extraction from the device. In some embodiments, the growth substrate may remain part of the device.

As illustrated in FIG. 1, in an area 36 between two devices, known as a "street," a portion 38 of dielectric layer 34 described above is left. As illustrated in FIG. 1, the portion 38 of dielectric layer 34 in the street is disposed over an etched surface of the semiconductor structure 20; i.e., the surface of n-type region 22 exposed by etching a mesa. The street may be, for example, between 1 and 10 microns wide and is often about five microns wide. The street is cut, for example by sawing, by laser scribing, or by laser scribing and breaking, to singulate the wafer into individual dice. The wafer may be diced, for example, after a wafer of devices is attached to a wafer of mounts, or before attaching to the mount. Dielectric portion 38 may improve adhesion of underfill 58 to wafer 10, particularly at the interface between semiconductor material (n-type region 22) and underfill 58. Improving the adhesion of the underfill to the wafer may improve the reliability of the semiconductor devices by forming a seal that prevents contaminants from reaching the device, and may reduce damage or avoid failure caused by insufficient support of wafer 10.

Figure 2:
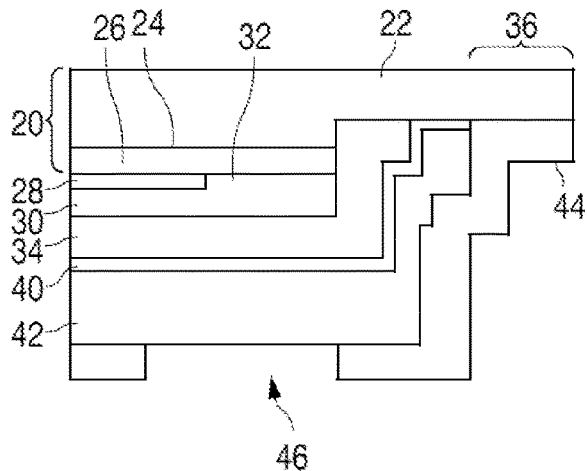
FIG. 2 illustrates a portion of a wafer of flip chip light emitting devices with a dielectric layer disposed over a bonding metal and in a street between adjacent devices (adjacent devices are not shown).

FIG. 2 illustrates a portion of a wafer of thin film flip chip light emitting devices. The structure illustrated in FIG. 2 includes a passivation layer 44. Semiconductor structure 20 is grown, then p-contact 28, guard layers 30 and 32, dielectric 34, n-contact 40, and bonding layer 42 are formed and patterned as described above in reference to FIG. 1. Passivation layer 44 is deposited over bonding layer 42. Passivation layer 44 may be any suitable material such as, for example, an insulating or dielectric layer, AlN, TiN, $SiO_2$, $SiN_xO_y$, $SiN_x$, or $Si_3N_4$, formed by, for example, any suitable method including sputtering, e-beam evaporation, CVD, PECVD, or spin-coating or dip-coating the structure with appropriate precursor materials, then curing the precursor materials to form a high density insulating dielectric. Passivation layer 44 may be a single layer or a multi-layer structure. Passivation layer 44 is patterned by conventional photolithography techniques to form one or more openings 46 which allow the structure to be connected to a mount (not shown in FIG. 2) by, for example, attaching bonding layer 42 to a bonding layer formed on a mount, as described above in reference to FIG. 1. Passivation layer 44 may be left in streets 36 between adjacent devices.

Passivation layer 44 covers the device, except in areas where conductive paths are required for attaching to electrodes on the mount. Passivation layer 44 seals the side of the device by coating the side of bonding layer 42 and n-contact 40. In the areas where it is formed, passivation layer 44 passivates the structure by protecting the device from corrosion, etching, oxidation, and other processes that may damage the device during operation or processing. For example, passivation layer 44 may reduce or prevent the intrusion of corrosive species such as water vapor, which may improve the performance of the device and/or reduce failure rates. In some embodiments, the thickness of passivation layer 44 is selected to reflect any light emitted by active region 24 that may be incident on passivation layer 44. Passivation layer 44 may improve the adhesion of an underfill to the wafer, as described above in reference to FIG. 1.

Figure 3:
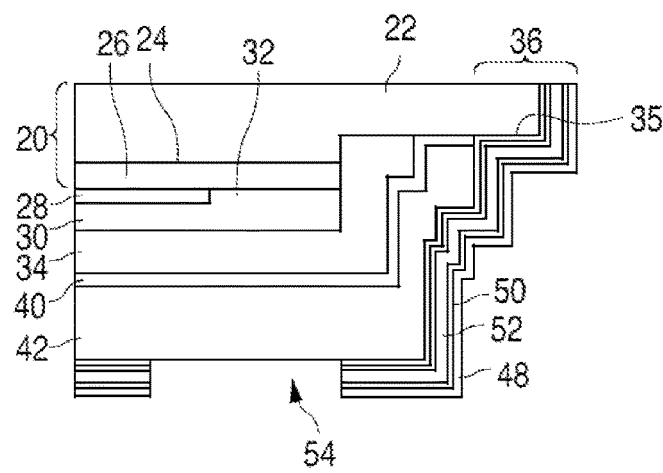
FIG. 3 illustrates portion of a wafer of flip chip light emitting devices with a reflective dielectric stack disposed in a street between adjacent devices (adjacent devices are not shown).

In FIG. 3, the passivation layer 44 of FIG. 2 is replaced by a multilayer dielectric stack 48. Multilayer dielectric stack 48 may include several pairs of alternating layers of two materials 50 and 52 with different refractive indices. Examples of suitable materials include, for example, $SiN_x$, $Si_3N_4$ and $SiO_2$ formed by, for example, the techniques described above for forming passivation layer 44 of FIG. 2, or any other suitable technique. Materials 50 and 52 are selected to form a stack 48 that reflects any light from active region 24 that is incident on stack 48. Openings 54 are formed in stack 48 where necessary for electrical and/or physical contact to bonding layer 42. Multilayer stack 48 may improve the adhesion of an underfill to the wafer, as described above in reference to FIG. 1.

In some embodiments, as illustrated in FIG. 3, in or adjacent to street 36, all or a portion 35 of the semiconductor structure remaining after the mesa etch may be removed to expose the growth substrate (not shown in FIG. 3). The passivation layer (underfill 58 in FIG. 1, passivation layer 44 in FIG. 2, and stack 48 in FIG. 3) may extend over the side of the semiconductor structure where the entire thickness of the semiconductor structure 20 is removed, as illustrated in FIG. 3. Extending the passivation layer over the edge of semiconductor structure 20 may further improve passivation of the structure and extraction from the device, by reflecting light incident on the interface between n-type region 22 and stack 48.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method, comprising:
   providing a wafer comprising a plurality of semiconductor light emitting devices, each light emitting device comprising an active region disposed between an n-type region and a p-type region, and a metal bonding layer coupled to an exposed portion of the n-type region;
   disposing a first material comprising a dielectric layer on the wafer, including disposing a portion of the dielectric layer directly on a first area of the exposed portion of the n-type region that is located between two semiconductor light emitting devices;
   disposing a second material comprising an underfill in areas between the wafer and a mount, including disposing the underfill directly on (1) the portion of the dielectric layer and (2) a second area of the exposed portion of the n-type layer, the portion of the dielectric layer improving adhesion of the underfill to the exposed portion of the n-type layer; and
   attaching the wafer to the mount.

2. The method of claim 1, further comprising separating the plurality of semiconductor light emitting devices by singulating the wafer in the first area where the portion of the dielectric layer is disposed.

3. The method of claim 1, wherein the dielectric layer comprises $Si_3N_4$.

4. The method of claim 1, further comprising a passivation layer configured to prevent contaminants from contacting the semiconductor light emitting device.

5. The method of claim 2, wherein the separating the plurality of semiconductor light emitting devices by singulating the wafer further comprises one of sawing, laser scribing, and breaking.

6. The method of claim 2, wherein the separating the plurality of semiconductor light emitting devices by singulating the wafer further comprises singulating after the attaching the structure to a mount.

7. The method of claim 1, wherein the attaching the structure to the mount comprises attaching the wafer by the metal bonding layer to the mount.

8. The method of claim 1, further comprising forming an n-contact in a third area of the exposed portion of the n-type region the second area being between the first area and the third area.

9. The method of claim 8, further comprising forming a p-contact on the p-type region and forming a guard layer on the p-contact.

10. The method of claim 9, wherein:
    the disposing the dielectric layer on the wafer includes disposing the dielectric layer over the guard layer and the exposed portion of the n-type region; and
    the disposing the portion of the dielectric layer directly on the first area of the exposed portion of the n-type region comprises partially removing the dielectric layer on the exposed portion of the n-type region to leave behind the portion of the dielectric layer on the first area of the exposed portion of the n-type region.

11. The method of claim 10, wherein the metal bonding layer is formed over the n-contact.

12. A method of making a light emitting device, comprising:
    providing a wafer comprising a plurality of semiconductor light emitting devices on a growth substrate, each light emitting device comprising: a light emitting layer disposed between an n-type region and a p-type region, an n-contact on an exposed portion of the n-type region, and a metal bonding layer over the n-contact;
    disposing a passivation layer on the wafer, including over an outer side of the metal bonding layer, over an outer side of the n-contact, and on top of the exposed portion of the n-type region in a street between two semiconductor light emitting devices;
    disposing an underfill in areas between the wafer and a mount, including over an outer side of the passivation layer, the passivation layer improving adhesion of the underfill to the wafer;
    attaching the wafer to the mount; and
    separating the two semiconductor light emitting devices by singulating the wafer in the street.

13. The method of claim 12, wherein the passivation layer is at least one of an insulating layer, a dielectric layer, AlN, TiN, $SiO_2$, $SiN_xO_y$, $SiN_x$, and $Si_3N_4$.

14. The method of claim 12, wherein the passivation layer is configured to reflect light emitted by the light emitting layer.

15. The method of claim 12, wherein the passivation layer is a multilayer dielectric stack.

16. The method of claim 12, further comprising removing a part of the exposed portion of the n-type region to expose a portion of the growth substrate in or adjacent to the street, wherein the disposing the passivation layer on the wafer further comprises disposing the passivation layer over an outer side of the exposed portion of the n-type region and on top of the exposed portion of the growth substrate.

* * * * *